(12) United States Patent
Kim et al.

(10) Patent No.: US 8,084,941 B2
(45) Date of Patent: Dec. 27, 2011

(54) ORGANIC LIGHT EMITTING DIODE DISPLAY HAVING IMPROVED MECHANICAL STRENGTH

(75) Inventors: Hun Kim, Yongin (KR); Tae-Wook Kang, Yongin (KR); Zail Lhee, Yongin (KR); Seung-Yeon Cho, Yongin (KR); Mi-Sook Suh, Yongin (KR); Hyun-Chol Bang, Yongin (KR)

(73) Assignee: Samsung Mobile Display Co., Ltd., Yongin, Gyunggi-do (KR)

( * ) Notice: Subject to any disclaimer, the term of this patent is extended or adjusted under 35 U.S.C. 154(b) by 95 days.

(21) Appl. No.: 12/558,311

(22) Filed: Sep. 11, 2009

(65) Prior Publication Data

US 2010/0066232 A1    Mar. 18, 2010

(30) Foreign Application Priority Data

Sep. 12, 2008    (KR) .................. 10-2008-0090342

(51) Int. Cl.
*H01L 51/50* (2006.01)
*H01L 51/52* (2006.01)
(52) U.S. Cl. ...... 313/512; 313/503; 313/509; 315/169.3
(58) Field of Classification Search .......... 313/498–512; 315/169.1, 169.3
See application file for complete search history.

(56) References Cited

U.S. PATENT DOCUMENTS

| | | | |
|---|---|---|---|
| 2003/0038913 A1* | 2/2003 | Choo | 349/149 |
| 2005/0184927 A1* | 8/2005 | Kwak | 345/45 |
| 2006/0283770 A1* | 12/2006 | Schauer | 206/710 |
| 2007/0170859 A1 | 7/2007 | Choi et al. | |

FOREIGN PATENT DOCUMENTS

| | | |
|---|---|---|
| CN | 1658713 | 8/2005 |
| JP | 2002-216949 | 8/2002 |
| JP | 2004-319507 | 11/2004 |
| JP | 2007-171440 A | 7/2007 |
| JP | 2007-200835 A | 8/2007 |

(Continued)

OTHER PUBLICATIONS

Japanese Office Action dated Jun. 21, 2011 for Japanese Patent Application No. JP 2009-189498 which shares priority of Korean Patent Application No. KR 10-2008-0090342 with captioned U.S. Appl. No. 12/558,311.

(Continued)

*Primary Examiner* — Nimeshkumar Patel
*Assistant Examiner* — Jose M Diaz
(74) *Attorney, Agent, or Firm* — Knobbe, Martens, Olson & Bear LLP

(57) ABSTRACT

The present invention is related to an OLED display, and one aspect of the OLED display includes a substrate member, an insulating layer formed on the substrate member, a metal wire formed on the insulating layer and having a plurality of joining enhancement holes, a sealant formed on the metal wire, and a sealing member attached on the sealant. In some embodiments, the joining enhancement holes efficiently suppress stripping of the sealant from the metal wire, since the sealant can integrally bond with the interlayer insulating layer through the joining enhancement holes. This feature may compensate for any weak bonding adherence between the sealant and metal wire. In some embodiments, the area of the joining enhancement holes may range from about 5% to about 60% of the entire area of the metal wire.

11 Claims, 5 Drawing Sheets

FOREIGN PATENT DOCUMENTS

| | | |
|---|---|---|
| JP | 2007-200887 A | 8/2007 |
| JP | 2007-328027 | 12/2007 |
| KR | 10-2002-0009498 | 2/2002 |
| KR | 10-2005-0048133 A | 5/2005 |
| KR | 10-2005-0081541 | 6/2005 |
| KR | 10-2005-0081541 | 8/2005 |
| KR | 10-2007-0010422 A | 1/2007 |

OTHER PUBLICATIONS

Chinese Office Action dated Oct. 10, 2011 for Chinese Patent Application No. CN200910176310.8 which shares priority of Korean Patent Application No. KR 10-2008-0090342 with captioned U.S. Appl. No. 12/558,311.

* cited by examiner

ORGANIC LIGHT EMITTING DIODE DISPLAY HAVING IMPROVED MECHANICAL STRENGTH

CROSS-REFERENCE TO RELATED APPLICATIONS

This application claims priority to and the benefit of Korean Patent Application No. 10-2008-0090342 filed in the Korean Intellectual Property Office on Sep. 12, 2008, the entire contents of which are incorporated herein by reference.

BACKGROUND

1. Field of the Invention

The present invention relates to an organic light emitting diode (OLED) display. More particularly, the present invention relates to an OLED display having improved mechanical strength.

2. Description of the Related Art

An OLED display is a self-luminance display, and thus, does not need a separate light source. This characteristic enables OLED displays to have reduced thickness and weight than other types of displays. Furthermore, OLED displays have other advantages, such as relatively low power consumption, high luminance, and high reaction speed. For these and other reasons, OLED displays are used in many applications, such as mobile electronic devices.

In general, an OLED display includes a display substrate in which a thin film transistor and organic light emitting elements are formed, a sealing member for covering the display substrate, and a sealant that bonds the display substrate and the sealing member. The sealant is coated along the edges of the substrate and forms a sealed space between the display substrate and the sealing member. The sealant, however, partially contacts any metal wire formed in the display substrate.

Unfortunately, the sealant and the metal wire are made of different materials, and thus, the adherence interface between them is usually weak. Therefore, the display substrate and the sealing member can become easily stripped or separated where the sealant and the metal wire contact each other.

The above information disclosed in this Background section is only for enhancement of understanding of the background of the invention and therefore it may contain information that does not form the prior art that is already known in this country to a person of ordinary skill in the art.

SUMMARY

Embodiments of the present invention provide an organic light emitting diode (OLED) display having improved mechanical strength by suppressing stripping. In one embodiment, an exemplary OLED display includes a substrate member, an insulating layer formed on the substrate member, a metal wire formed on the insulating layer and having a plurality of joining enhancement holes, a sealant formed on the metal wire, and a sealing member attached on the sealant.

The insulating layer and the sealant may contact each other through joining enhancement holes of the metal wire. A ratio of an area where the joining enhancement holes are formed may range from about 5% to about 60% of the entire area of the metal wire. In various embodiments, both of the insulating layer and the sealant may be made of ceramic-based materials. The sealing member may also be made of a ceramic-based material.

DETAILED DESCRIPTION OF SOME EMBODIMENTS

Figure 1:
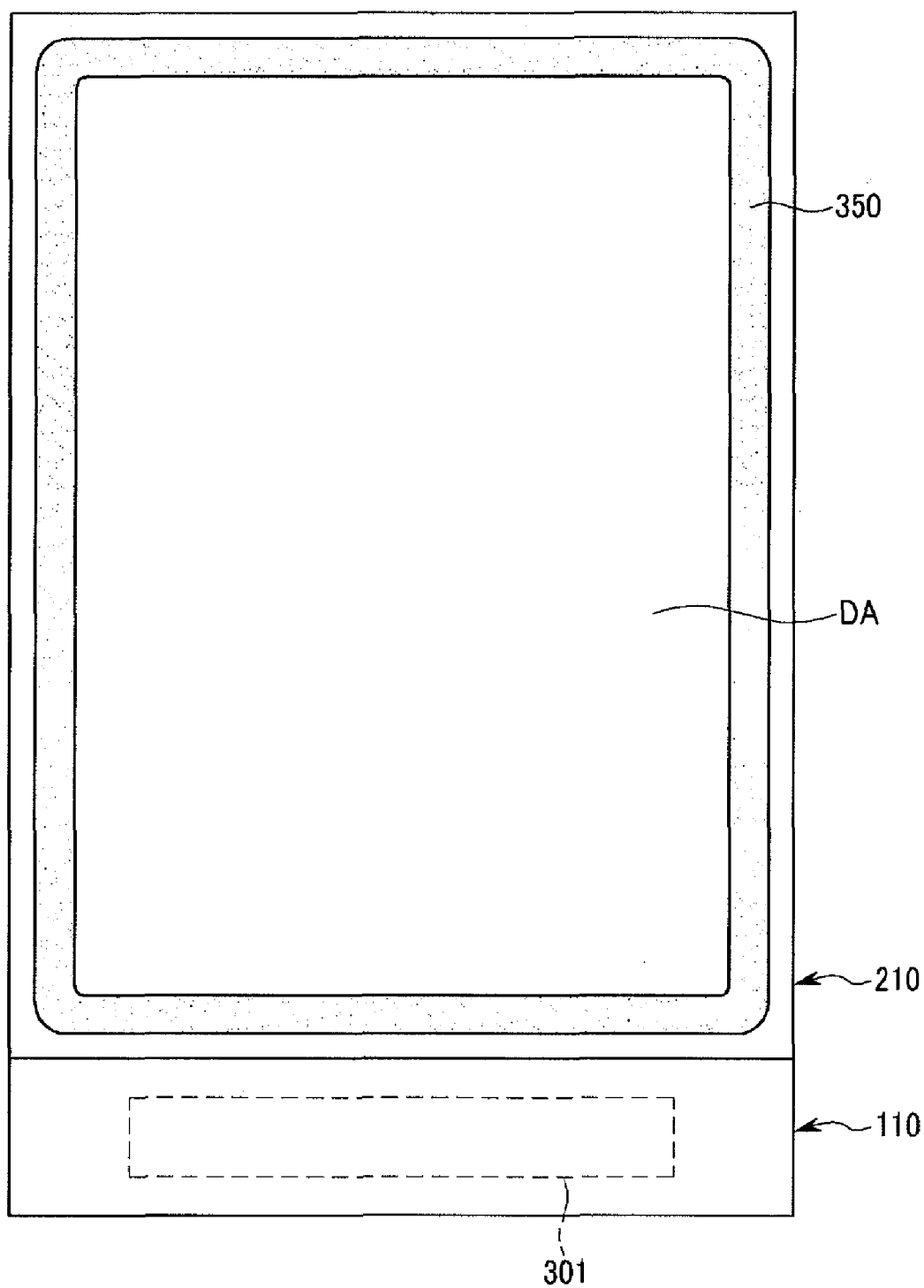
FIG. 1 is a top plan view of an organic light emitting diode (OLED) according to an exemplary embodiment of the present invention.

The present invention will be described with reference to the accompanying drawings, in which exemplary embodiments of the invention are shown. As those skilled in the art will realize, the described embodiments may be modified in various different ways, all without departing from the spirit or scope of the present invention. Constituent elements having the same configuration are representatively described with reference to one or more embodiments. Other exemplary embodiments may then be described by referring to various differences between the embodiments.

The drawings and description are to be regarded as illustrative in nature and not restrictive. Like reference numerals designate like elements throughout the specification.

In the drawings, the thickness of layers, films, panels, regions, etc., are exaggerated for clarity. In addition, the size and thickness of each element in the drawing are provided for better understanding and ease of description of various embodiments and are not intended to limit the present invention. For example, it should be understood that when an element such as a layer, film, region, or substrate is referred to as being "on" another element, it can be directly on the other element or intervening elements may also be present. When an element is referred to as being "directly on" another element, there are no intervening elements present.

In addition, in the accompanying drawings, an organic light emitting diode (OLED) display is illustrated as an active matrix (AM)-type OLED display in a 2Tr-1Cap structure in which two thin film transistors (TFTs) and one capacitor are formed in one pixel. But, the present invention is not limited thereto and some embodiments of the OLED display can have various structures. For example, three or more TFTs and two or more capacitors can be provided in one pixel of the OLED display and separate wires can be further provided in the OLED display.

As shown in FIG. 1, an organic light emitting diode (OLED) display 100 includes a display substrate 110, a sealing member 210 that covers the display substrate 110, and a sealant 350 interposed between the display substrate 110 and the sealing member 210. The sealant 350 is disposed along an edge of the sealing member 210, and attaches the substrate 110 and the sealing member 210 to be sealed. Hereinafter, the inside area between the display substrate 110 and the sealing member 210 surrounded by the sealant 350 will be referred to as a display area DA. A plurality of pixels may be formed in the display area DA to display an image.

The sealing member 210 is smaller than the display substrate 110. Accordingly, some components may be external to the sealing member 210. For example, an integrated circuit (IC) chip 301 may be mounted on an edge of one side of the substrate 110, and thus, is not covered by the sealing member 210.

Figure 2:
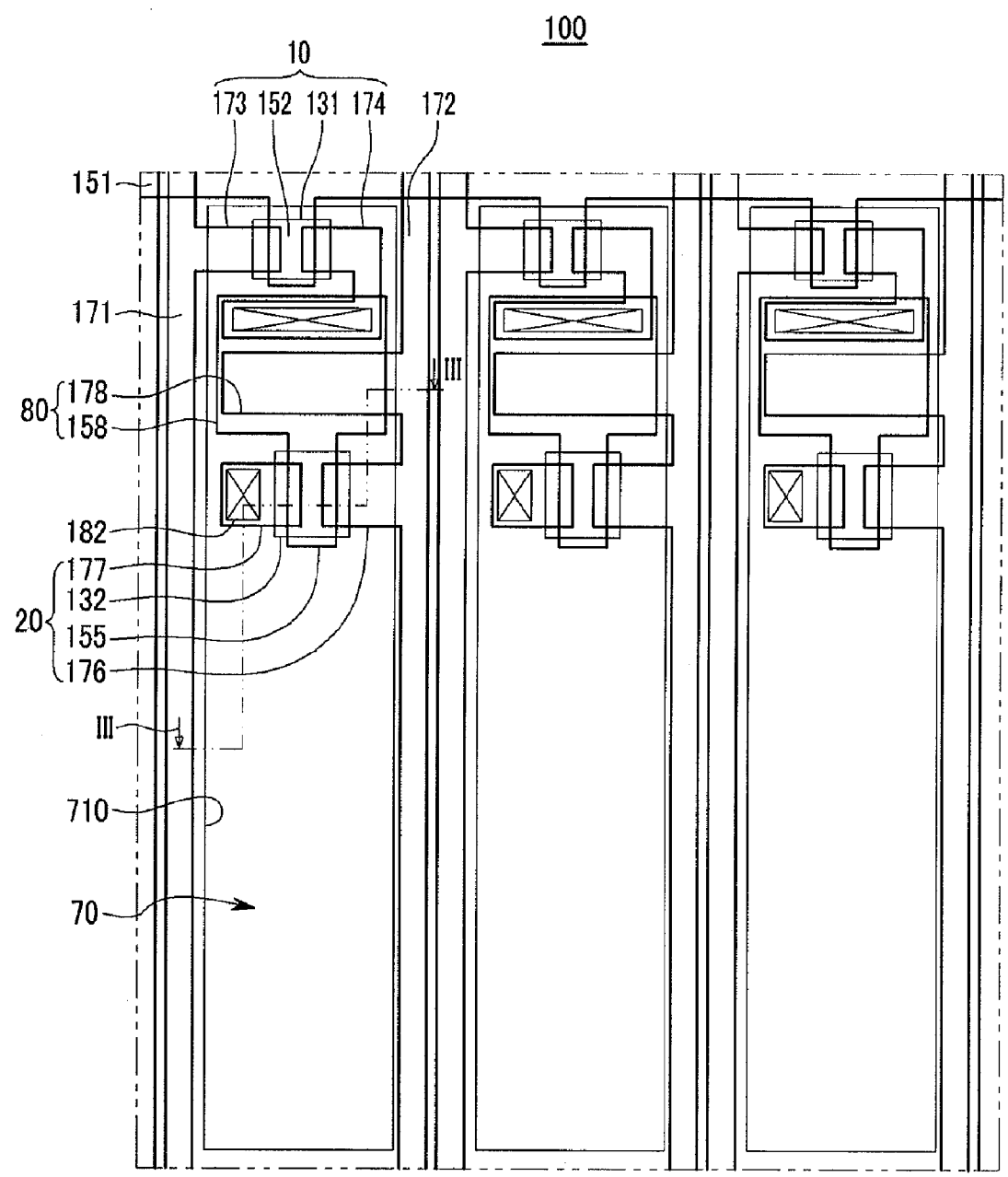
FIG. 2 is an enlarged layout view of a part of a display area of FIG. 1.
Figure 3:
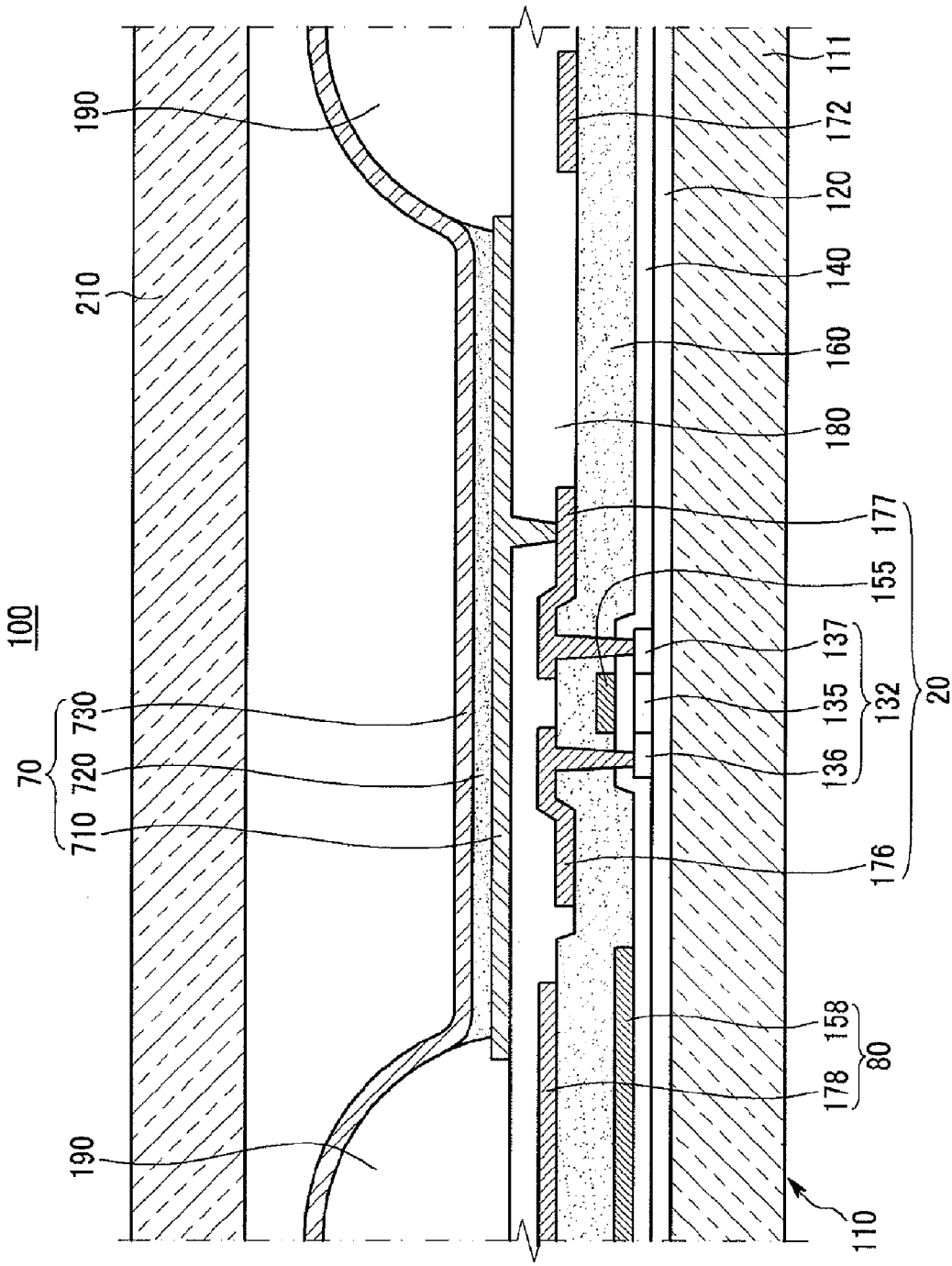
FIG. 3 is a cross-sectional view of FIG. 2, taken along the line III-III.

Referring now to FIG. 2 and FIG. 3, an internal structure of the OLED display 100 will be described with respect to the plurality of pixels formed in the display area DA. As shown in FIG. 2, the display substrate 110 includes a switching thin film transistor (TFT) 10, a driving TFT 20, an OLED 70, and a capacitor 80 that are formed in each pixel. In addition, the display substrate 110 further includes gate lines 151 disposed along one direction, and data lines 171 and common power lines 172 that respectively cross the gate lines 151 to be insulated therefrom. In the example shown, the boundary of one pixel may be defined by the gate line 151, the data line 171, and the common power line 172.

The switching TFT 10 is used as a switch for selecting a pixel to be light-emitted. The switching TFT 10 includes a switching semiconductor layer 131, a switching gate electrode 152, a switching source electrode 173, and a switching drain electrode 174, and the driving TFT 20 includes a driving semiconductor layer 132, a driving gate electrode 155, a driving source electrode 176, and a driving drain electrode 177. The switching gate electrode 152 is connected to the gate line 151. The switching source electrode 173 is connected to the data line 171. The switching drain electrode 174 is disposed at a distance from the switching source electrode 173 and is connected to the first capacitive plate 158.

The driving TFT 20 applies a driving voltage to the first electrode 710 for light emission of on organic emission layer 720 of an OLED 70 in a selected pixel. The driving gate electrode 155 is connected to the first capacitive plate 158. The driving source electrode 176 and the second capacitive plate 178 are respectively connected to the common power line 172. The driving drain electrode 177 is connected to the first electrode 710 of the OLED 70 through a contact hole 182. With the above-described structure, the switching TFT 10 is driven by a gate voltage applied to the gate line 151 to transmit a data voltage applied to the data line 171 to the driving TFT 20. Although the driving film transistor 20 of FIG. 2 is a polycrystalline thin film transistor including a polysilicon layer, the switching thin film transistor 10 (not shown in FIG. 2) may be a polycrystalline thin film transistor or an amorphous thin film transistor including an amorphous silicon layer.

The OLED 70 includes a first electrode 710, an organic emission layer 720 (shown in FIG. 3) formed on the first electrode 710, and a second electrode 730 (shown in FIG. 3) formed on the organic emission layer 720. Here, the first electrode 710 is a positive (+) electrode which is a hole injection electrode, and the second electrode 730 is a negative (−) electrode which is an electron injection electrode. However, the present invention is not limited thereto. For example, the first electrode 710 can be the negative electrode and the second electrode 730 can be the positive electrode. Holes and electrons are respectively injected from the first electrode 710 and the second electrode 730 into the organic emission layer 720, and form excitons. When the excitons change from an excited state to a base state, light is emitted.

The capacitor 80 stores the voltage that corresponds to a voltage difference between a common voltage transmitted from the common power line 172 to the driving thin film transistor 20 and the data voltage transmitted from the switching thin film transistor 10. The capacitor 80 may then provide a current to the OLED 70 through the driving thin film transistor 20 so that the OLED 70 emits light. The capacitor 80 includes a first capacitive plate 158 and a second capacitive plate 178 with a gate insulating layer 140 interposed therebetween. Here, the gate insulating layer 140 becomes a dielectric material. Capacitance of the capacitor 80 is determined by charges charged in the capacitor 80 and a voltage between the first and second capacitive plates 158 and 178.

Referring now to FIG. 3, a structure of the OLED display 100 will now be described in further detail in a stack order. In addition, a structure of the TFT 20 will be further described.

First, the display substrate 110 will be described. A first substrate member 111 is formed as an insulation substrate that is made of glass, quartz, ceramic, plastic, etc. However, the present invention is not limited thereto. For example, the first substrate member 111 can be formed from a metal like stainless steel.

A buffer layer 120 is formed on the first substrate member 111. The buffer layer 120 prevents impurities from permeating. The buffer layer 120 also provides a planarization surface. The buffer layer 120 may be made of various materials for performing such functions. For example, the buffer layer 120 may include one of a silicon nitride (SiNx) layer, a silicon dioxide (SiO2) layer, and a silicon oxynitride (SiOxNy) layer. However, the buffer layer 120 is not always necessary. Thus, the buffer layer 120 may be omitted according to type and process conditions of the first substrate member 111.

The driving semiconductor layer 132 is formed on the buffer layer 120. The driving semiconductor layer 132 is formed of a polysilicon layer. In addition, the driving semiconductor layer 132 includes a channel region 135 in which impurities are not doped. A source region 136 and a drain region 137 are doped with p+ impurities at respective sides of the channel region 135. The doped ion material may be a P-type impurity, such as boron (B) material like $B_2H_6$, as the doped ion material. Different impurities may be employed in accordance with the type of thin film transistor used. In one embodiment, a PMOS-structured thin film transistor using the P-type impurity is used as the driving thin film transistor 20. However, a NMOS-structured thin film transistor or a CMOS-structured thin film transistor can also be used as the driving thin film transistor 20.

The gate insulation layer 140 made of silicon nitride (SiNx) or silicon dioxide (SiO2) is formed on the driving semiconductor layer 132. A gate wire including the driving gate electrode 155 is formed on the gate insulating layer 140. The gate wire further includes the gate line 151, the first capacitive plate 158, and other wires. In addition, the driving gate electrode 155 is formed to overlap at least a part of the driving semiconductor layer 132, and particularly, is formed to overlap the channel region 135.

An interlayer insulation layer 160 that covers the driving gate electrode 155 is formed on the gate insulating layer 140. The gate insulating layer 140 and the interlayer insulating layer 160 share through-holes exposing the source region 136 and the drain region 137 of the driving semiconductor layer 132. Like the gate insulating layer 140, the interlayer insulating layer 160 is made of a ceramic-based material, such as silicon nitride (SiNx) or silicon dioxide ($SiO_2$).

A data wire including the driving source electrode 176 and the driving drain electrode 177 is formed on the interlayer insulating layer 160. The data wire further includes the data line 171, the common power line 172, the second capacitive plate 178, and other wires. In addition, the driving source electrode 176 and the driving drain electrode 177 are respectively connected to the source region 136 and the drain region 137 of the driving semiconductor layer 132 through the through-holes respectively formed in the interlayer insulation layer 160 and the gate insulation layer 140.

A planarization layer 180 that covers the data wires 172, 176, 177, and 178 is formed on the interlayer insulating layer 160. The planarization layer 180 removes steps and performs planarization in order to increase luminous efficiency of the OLED 70. In addition, the planarization layer 180 has a contact hole 182 through which the drain electrode 177 is partially exposed.

The planarization layer 180 can be made of at least one of polyacrylate resin, epoxy resin, phenolic resin, polyamide resin, polyimide resin, unsaturated polyesters resin, poly phenylenether resin, polyphenylenesulfide resin, and benzocyclobutene (BCB). The first exemplary embodiment of the present invention is not limited to the above-described structure. For example, one of the planarization layer 180 and the interlayer insulating layer 160 can be omitted as desired.

The first electrode 710 of the organic light emitting element 70 is formed on the planarization layer 180. That is, in the OLED display 100, a plurality of pixel electrodes 710 are disposed in each of the respective pixels. In this case, the plurality of first electrodes 710 are respectively disposed at a distance from each other. The first electrode 710 ix connected to the drain electrode 177 through the contact hole 182 of the planarization layer 180.

In addition, a pixel defining layer 190 having an opening that exposes the pixel electrodes 710 is formed on the planarization layer 180. That is, the pixel defining layer 190 includes a plurality of openings formed in each pixel. In addition, the first electrode 710 is disposed to correspond to the opening of the pixel defining layer 190. Thus, the first electrode 710 can be disposed under the pixel defining layer 190 to be partially overlapped by the pixel defining layer 190. The pixel defining layer 190 can be made of an inorganic material of a resin or silica group, such as polyacrylate resin and polyimide.

As described above, the OLED 70 includes the pixel electrode 710, the organic emission layer 720, and the common electrode 730. The organic emission layer 720 is formed on the first electrode 710 and the second electrode 730 is formed on the organic emission layer 720.

The organic emission layer 720 is made of a low-molecular organic material or a high-molecular organic material. The organic emission layer 720 is formed in a multi-layer structure including at least one of a hole injection layer (HIL), a hole transport layer (HTL), an emission layer, an electron transport layer (ETL), and an electron injection layer (EIL). When the organic emission layer 720 is formed in a multi-layer structure including all the layers HIL, HTL, ETL, and EIL, the HIL is formed on the pixel electrode 710, which is a positive electrode, and the HTL, ETL, and EIL are sequentially stacked thereon.

In addition, as shown in FIG. 3, the organic emission layer 720 is disposed only in the opening of the pixel defining layer 190. However, the organic emission layer 720 can be formed not only on the first electrode 170 in the opening of the pixel defining layer 190, but also between the pixel defining layer 190 and the second electrode 730. The organic emission layer 720 can further include several layers including an emission layer, an HIL, an HTL, an ETL, and an EIL. In this case, like the second electrode 730, excluding the emission layer, the HIL, HTL, ETL, and EIL can be formed not only on the first electrode 710, but also on the pixel defining layer 190 by using an open mask in a manufacturing process. That is, at least one of the layers included in the organic emission layer 720 can be interposed between the pixel defining layer 190 and the second electrode 730.

Each of the first electrode 710 and the second electrode 730 can be made of a transparent conductive material or a reflective or reflective conductive material. According to materials that form the first electrode 710 and the second electrode 730, the OLED display 100 can be classified as a top light emitting type, a bottom light emitting type, and a dual-side light emitting type.

In one embodiment, the OLED display 100 is a top light emitting type of OLED display. Thus, the OLED emits light toward an encapsulation substrate 210 to display an image. In addition, the first electrode 710 is made of a reflective conductive material.

For the transparent conductive material, indium tin oxide (ITO), indium zinc oxide (IZO), zinc oxide (ZnO), or indium oxide (In2O3) can be used. For the reflective or transflective material, lithium (Li), calcium (Ca), fluorinated lithium/calcium (LiF/Ca), fluorinated lithium/aluminum (LiF/Al), aluminum (Al), silver (Ag), magnesium (Mg), or gold (Au) can be used.

The sealing member 210 is formed on the second electrode 730 and they face each other. The sealing member 210 can be made of a transparent material, such as glass and plastic. The sealing member 210 is bonded to the display substrate 110 through a sealant 350 (shown in FIG. 1) formed along the edges thereof.

Figure 4:
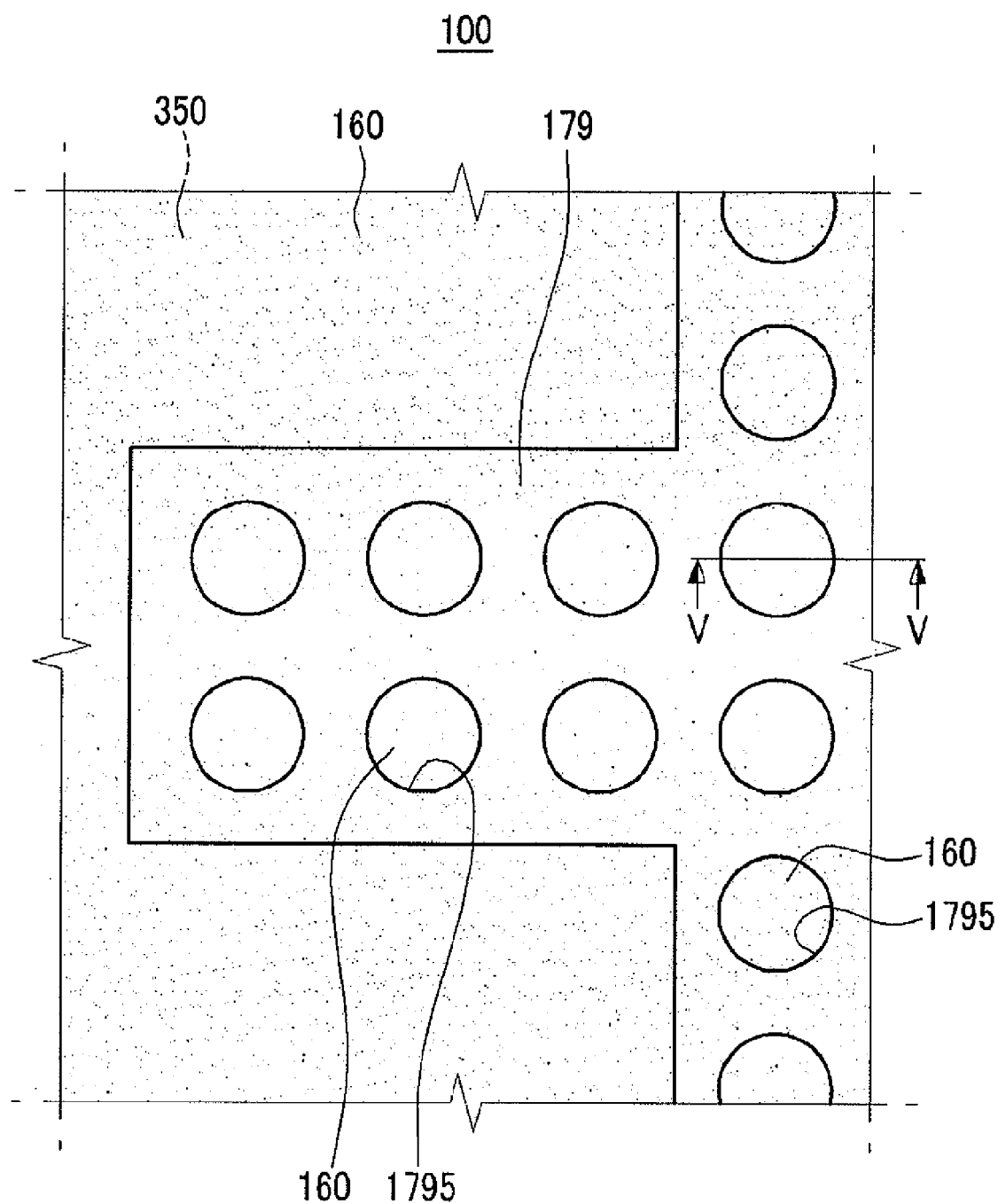
FIG. 4 is an enlarged layout view of a part of an area where a sealant of FIG. 1 is formed.
Figure 5:
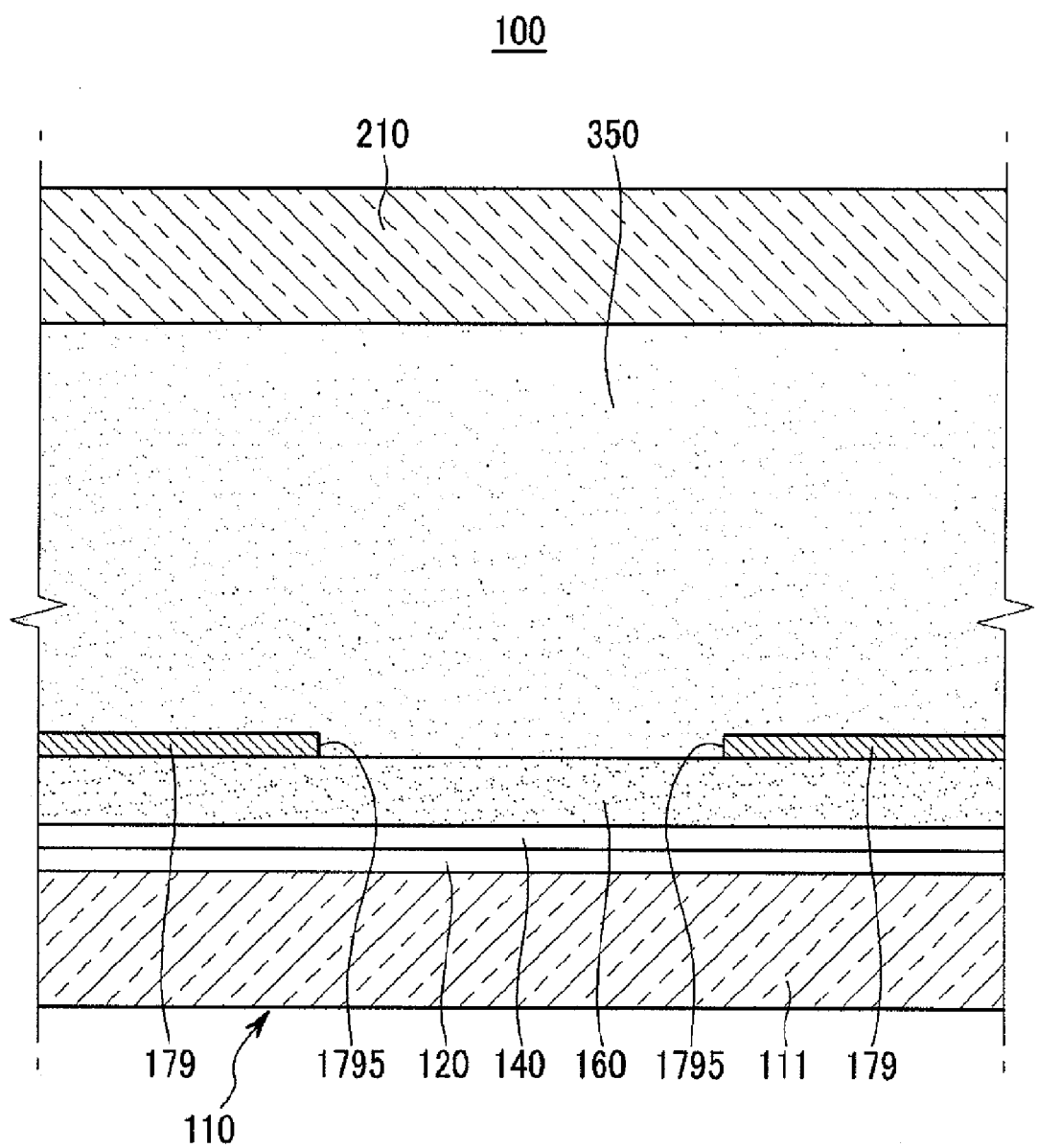
FIG. 5 is a cross-sectional view of FIG. 4, taken along the line V-V.

Referring now to FIG. 4 and FIG. 5, an internal structure of the OLED display 100 will be described with respect to an area where the sealant 350 is formed. As shown in FIG. 4 and FIG. 5, the buffer layer 120, the gate insulating layer 140, and the interlayer insulating layer 160 are sequentially formed on the substrate member 111. The buffer layer 120, the gate insulating layer 140, and the interlayer insulating layer 160 have been previously described in detail. In addition, a metal wire 179 is formed on the interlayer insulating layer 160.

The metal wire 179 may be one or more of the source electrode 176, the drain electrode 177 of the TFT 20 formed in the area where the sealant 350 is disposed, the second capacitive plate 178 of the capacitor 80, the data line 171, the common power line 172, and other connection lines. Herein, the connection line may refer to a wire that connects components respectively formed in the display area DA surrounded by the sealant 350 and an external peripheral area of the sealant 350. The metal wire 179 can be made of the same material as at least one of the source electrode 176, the drain electrode 177 of the TFT 20 formed in the display area DA, the second capacitive plate 178 of the capacitor 80, the data line 171, and the common power line 172. In addition, the metal wire 179 may include a plurality of joining enhancement holes 1795. The joint or joining enhancement holes 1795 expose the interlayer insulating layer 160 under the metal wire 179. One skilled in the art will recognize that the term "holes" should be interpreted broadly. For example, any opening or shape may serve as the joining enhancement holes 1795. In addition, the joining enhancement holes 1795 may be uniform or varied depending on their location on the metal wire 179 and the desired bonding strength. As shown in FIG. 4, the joint enhancement holes 1795 may be circular in shape, uniform in size, and uniform in distribution, which are exemplary in nature. One skilled in the art will recognize that the openings which serve as the joint enhancement holes 1795 may also be formed in other shapes, such as elliptical, square, rectangular, hexagon, etc. In addition, the size and distribution of the joining enhancement holes 1795 may vary.

The sealant 350 is formed on the metal wire 179 and the sealing member 210 is attached on the sealant 350. In addition, the sealant 350 has integrated contact with the interlayer insulating layer 160 through the joint enhancement holes 1795 of the metal wire 179. One side of the sealant 350 contacts the sealing member 210 and the other side connects the metal wire 179, the interlayer insulating layer 160 exposed through the joint enhancement holes 1795 of the metal wire 179, and an interlayer insulating layer 160 formed in an area where the metal wire 179 is not formed. Accordingly, the sealant 350 bonds the sealing member 210 and the display substrate 110 to be sealed. In addition, the sealant 350 may be made of a ceramic-based material, for example, a frit.

When the sealant 350 is made of a ceramic-based material, it may have a relatively weak interface adherence with the metal wire 179. However, the sealant 350 has a relatively stronger interface adherence compared to the interlayer insulating layer 160, which is made of the same ceramic-based material.

The plurality of joining enhancement holes 1795 may be formed on the metal wire 179 to efficiently suppress stripping of the sealant 350 and the metal wire 179 that are bonded to each other. That is, since the sealant 350 is integrally bonded with the interlayer insulating layer 160 through the joint enhancement holes 1795 of the metal wire 179. Accordingly, this feature may compensate for the relatively weak bonding adherence between the sealant 350 and metal wire 1795.

In addition, a ratio of an area where the joint enhancement holes 1795 are formed may range from about 5% to about 60% of the entire area of the metal wire 179. When the ratio of the area where the joint enhancement holes 1795 are formed is less than about 5%, the weak bonding state between the sealant 350 and the metal wire 179 often cannot be compensated. However, when the ratio of the area where the joint enhancement holes 1795 are formed is greater than about 60%, the bonding force can be improved and the resistance of the metal wire 179 is increased.

Like the sealant 350, the sealing member 210 can be made of a ceramic-based material. Therefore, the sealing member 210 and the sealant 350 may have relatively high interface adherence.

With the above-described configuration, the OLED display 100 can improve mechanical strength by suppressing stripping. Hereinafter, an experimental example and a comparative example will be described with reference to the following table.

In an experiment, a plurality of OLED displays according to the experimental example and a plurality of OLED displays according to a comparative example are subjected to forces that cause stripping. In this experiment, the OLED display (i.e., the "Experimental Example") employed a joining enhancement hole in a metal wire according to an exemplary embodiment of the present invention. In addition, a ratio of an area where the joining enhancement hole is formed was about 10% of the entire area of the metal wire. As a comparison, an OLED display (i.e., the "Comparative Example") did not employ a joining enhancement hole in its metal wire. Results of the experiment are shown in Table 1 below.

TABLE 1

|  | Test | Stripping | Stripping ratio (%) | Average stripping pressure (Mpa) |
|---|---|---|---|---|
| Experimental Example | 620 | 3 | 0.5 | 162 |
| Comparative Example | 694 | 14 | 2 | 129 |

As shown in Table 1, the number of stripping occurrences of the experimental example was relatively small compared to the comparative example. In addition, the stripping pressure needed to create a stripping failure was higher in the experimental example, i.e., 162 Mpa versus 129 Mpa. Thus, the experimental example was able to endure higher pressure forces compared to the comparative example. Accordingly, based at least on this experimental data, it is believed the OLED display 100 possesses improved mechanical strength and resistance or suppression of stripping.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display comprising:
    a substrate member;
    an insulating layer formed on the substrate member;
    a metal wire formed on the insulating layer and having a plurality of joining enhancement holes;
    a sealant formed on and directly contacting the metal wire; and
    a sealing member attached on the sealant.

2. The OLED display of claim 1, wherein the insulating layer and the sealant contact each other through the joining enhancement holes of the metal wire.

3. The OLED display of claim 2, wherein a ratio of an area where the joining enhancement holes are formed is greater than about 5% of an area of the metal wire.

4. The OLED display of claim 3, wherein a ratio of an area where the joining enhancement holes are formed ranges from about 5% to about 60% of an area of the metal wire.

5. The OLED display of claim 1, wherein the insulating layer and the sealant are respectively made of ceramic-based materials.

6. The OLED display of claim 4, wherein the sealing member is made of a ceramic-based material.

7. The OLED display of claim 1, wherein the joining enhancement holes are circular in shape.

8. The OLED display of claim 1, wherein the joining enhancement holes are uniform in size.

9. The OLED display of claim 1, wherein the joining enhancement holes are evenly distributed across the metal wire.

10. The OLED display of claim 1, wherein an area of the joining enhancement holes ranges from about 5% to about 60% of an area of the metal wire.

11. The OLED display of claim 9, wherein the area of the joining enhancement holes is about 10% of the area of the metal wire.

* * * * *